United States Patent [19]

Widdershoven

[11] Patent Number: 5,530,275
[45] Date of Patent: Jun. 25, 1996

[54] SEMICONDUCTOR DEVICE FOR SUMMING WEIGHTED INPUT SIGNALS

[75] Inventor: Franciscus P. Widdershoven, Eindhoven, Netherlands

[73] Assignee: U.S. Philips Corporation, New York, N.Y.

[21] Appl. No.: 433,659

[22] Filed: May 4, 1995

[30] Foreign Application Priority Data

May 6, 1994 [EP] European Pat. Off. ............. 94201263

[51] Int. Cl.$^6$ .......................... H01L 29/788; H01L 29/76
[52] U.S. Cl. ......................... 257/319; 257/236; 257/238; 257/300; 257/315; 257/316
[58] Field of Search .................... 257/215, 236, 257/238, 300, 315, 316, 319

[56] References Cited

U.S. PATENT DOCUMENTS 5,266,820  11/1993  Van Berkel ............... 257/316

FOREIGN PATENT DOCUMENTS 6-104447  4/1994  Japan ........................ 257/315
93/24958  12/1993  WIPO ....................... 257/315
93/24957  12/1993  WIPO ....................... 257/315

OTHER PUBLICATIONS

"A Functional MOS Transistor Featuring Gate–Level Weighted Sum and Threshold Operations" by T. Shibata and T. Ohmi, published in IEEE Transactions on Electron Devices, vol. 39, No. 6, Jun. 1992, pp. 1444–1455.

*Primary Examiner*—Ngân Ngô
*Attorney, Agent, or Firm*—Steven R. Biren

[57] ABSTRACT

The invention relates to a semiconductor device with which input signals can be weighted and the weighted input signals can be summed, and which in conjunction with a neuron can be used, for example, as a synapse in a neural network. The device comprises a number of switched capacitances with a common capacitor plate formed by a surface region 3 in a p-type substrate 1. The region 3 is connected to the inverting input of an amplifier 11 whose + input is connected to a reference voltage and whose output 12 supplies the summed output signal. The output 12 can be fed back to the input 3 via switch S. The other plate of the capacitances is formed by an electrode 6a, 6b, 6c, which can be switched between a reference voltage and an input source. The weight factors are stored in the form of electric charges on a floating gate 5a, 5b, 5c, which is provided between each input electrode 6 and the surface region 3. During operation, the input signals are each converted into a depletion charge in the surface region 3 whose value is dependent not only on the input signal but also on the charge on the associated floating gate. The sum of the depletion charges is subsequently stored in an output capacitance 13,3 and read out by means of the amplifier 11.

11 Claims, 5 Drawing Sheets

SEMICONDUCTOR DEVICE FOR SUMMING WEIGHTED INPUT SIGNALS

BACKGROUND OF THE INVENTION

The invention relates to a semiconductor device for the summation of a number of weighted input signals, comprising a semiconductor body with a surface region of a first conductivity type adjoining a surface, which surface is provided with an electrode configuration which is insulated from the surface region and has an electrically floating gate and, for the supply of the signals to be summed, with a number of input electrodes which are electrically insulated from the surface of the semiconductor body and from the floating gate and which are capacitively coupled to the floating gate. The device may form, for example, a neural network in which electrical signals are weighted in synapses and in which the sum of the weighted input signals is convened into one or several output signals $Y_i$ by means of a non-linear function by neurons. The signals $Y_i$ themselves may again form input signals for neurons of a next layer.

A semiconductor device of the kind described in the opening paragraph is known inter alia from the article: "A Functional MOS Transistor Featuring Gate-Level Weighted Sum and Threshold Operations" by T. Shibata and T. Ohmi, published in IEEE Transactions on Electron Devices, vol. 39, no. 6, Jun. 1992, pp. 1444–1455. An MOS transistor with floating gate is described therein with a number of input gates which are capacitively coupled to the floating gate. The input signals are supplied to the input electrodes in weighted form, the potential of the floating gate being determined by the sum of the signals supplied to the input electrodes. A measurement of the source/drain current dependent on the potential of the floating gate can yield a parameter which is representative of the sum of the weighted input signals. In this device, additional means are to be provided for the storage of the weight factors and for weighting of the input signals, which may result in a very complicated circuit. The device is also strongly temperature-dependent, in particular owing to the temperature dependence of the mobility in the transistor channel.

SUMMARY OF THE INVENTION

It is an object of the invention to provide a semiconductor device of the kind described in the opening paragraph in which the storage of the weight factors, the multiplication of the input signals by the weight factors, and the summation of the weighted input signals can take place in a common switching element. A further object of the invention is to provide such a device in which the temperature dependence is very small, at least much smaller than in the known device described above.

The invention is based inter alia on the recognition that a compact configuration is obtained when the input signals are supplied to so-called switched capacitors, each of which is provided with a floating gate for storing the weight factors. According to the invention, a semiconductor device of the kind mentioned in the opening paragraph is characterized in that a floating gate electrode is associated with each input electrode, in that means are present for applying an electric charge to each of said floating gate electrodes, which charge is representative of a weight factor with which an input signal supplied to the associated input electrode is weighted, and in that the surface region merges into an adjoining portion of the semiconductor body of the second conductivity type via a pn junction and forms a charge storage region for storing electric charge whose value is indicative of the sum of the weighted input signals, means being present by which the surface region can be brought to a reference potential in a first operational state and to an electrically floating potential in a second operational state. As will become apparent from the description of the Figures, a particularly compact configuration is obtained through the integration of the memory function of the floating gate into the switched capacitor with which the multiplication of the input signal by the weight factor is carried out. A non-linear relation between the input voltage and the electric charge induced thereby is obtained in that the device can be operated in a voltage range in which only depletion occurs in the surface region, i.e. no inversion of the conductivity type at the surface. This may be advantageously used, as will become apparent, inter alia for inducing both positive and negative charge. It is noted that the surface region may be formed by a coherent zone which is common to all input electrodes. Alternatively, however, the surface region may be built up from a number of sub-regions separated from one another in the semiconductor body and interconnected by internal or external wiring.

A preferred embodiment in which inversion owing to thermal generation of minority carriers is prevented in a simple manner is characterized in that the surface region is provided with one or several regions forming a rectifying junction with the surface region, with which junction inversion of the conductivity type below the floating gates is prevented through the application of a reverse voltage.

The charge state of the surface region can be adjusted or read out by means of a differential amplifier of which one input is electrically connected to the surface region and the other input is connected to a junction point which is at a reference potential during operation. The output can be connected to the input by means of a switch, whereby the surface zone potential becomes equal or substantially equal to the reference potential. In the non-conducting state of the switch, the surface region is at an electrically floating potential. The charge state of the surface region can be determined in that a reference voltage is offered to the input electrodes while the surface region is floating. In an embodiment this may result in a potential of the surface region which is a measure for the charge state of the surface region, and thus for the sum of the weighted input signals. In another embodiment, the output of the amplifier is connected to the surface region via a feedback capacitor. The surface region is then held at a substantially constant voltage, i.e. the reference voltage at the other input of the amplifier, by the feedback capacitor, while the charge is stored entirely or substantially entirely in the feedback capacitor. The output signal is taken off from the amplifier output.

The feedback capacitor may have a fixed capacitance, and in some embodiments a constant capacitance which has a value within the relevant range of voltages which does not or substantially not vary with the voltage, whereby a linear relation between charge and output voltage is obtained. Another embodiment is characterized in that the feedback capacitor comprises an electrically conductive, floating region situated between the surface region which forms a plate of the feedback capacitor and a conductive layer forming the other plate of the feedback capacitor and insulated from the surface region and the interposed electrically floating region by insulating material. The capacitor may form a nonlinear transfer function of a neuron. This function is programmable by means of electric charge which can be applied to the floating gate in the feedback capacitor. The portion of the surface region belonging to the feedback capacitor may again form a coherent region with the sub-regions below the input electrodes or a separate sub-region which is connected to the other sub-regions by means of wiring.

Various techniques known inter alia from the field of non-volatile memories with floating gates may be used for setting the weight factors. An embodiment of the invention is characterized in that an injector region separated from the floating gate by a tunnel dielectric is associated with each of the input electrodes and the relevant floating gate. The charge state of the floating gate may be changed in a controllable manner, both digital and analog, via the tunnel dielectric through tunnelling of charge carriers. The injector region may be formed by a surface zone of the first conductivity type separated from the surface region.

The invention may be advantageously used in devices in which an input signal corresponds to a single input electrode. For carrying out more complicated operations, a number of input electrodes with an accompanying floating gate are used for an input signal, the input signal being applied thereto in various ways. A preferred embodiment is characterized in that said number of input electrodes is four, while the input signal is applied to the input electrodes such that, when the input signal $V_{in}$ resulting in a charge $Q_{d1}$ in the surface region is applied to a first input electrode and the input signal in the form $-V_{in}$ resulting in a charge $Q_{d2}$ is applied to a second input electrode, the input signal applied to a third input electrode is applied in a form whereby a charge $-Q_{d1}$ is induced in the surface region, givien a weight factor equal to the weight factor belonging to the first input electrode, and the input signal for the fourth input electrode is applied in a form whereby a charge $-Q_{d2}$ is induced in the surface region given a weight factor equal to the weight factor belonging to the second input electrode.

BRIEF DESCRIPTION OF THE DRAWING

The invention will be explained in more detail with reference to several embodiments and the accompanying diagrammatic drawing, in which.

DESCRIPTION OF THE PREFERRED EMBODIMENTS

Figure 1:
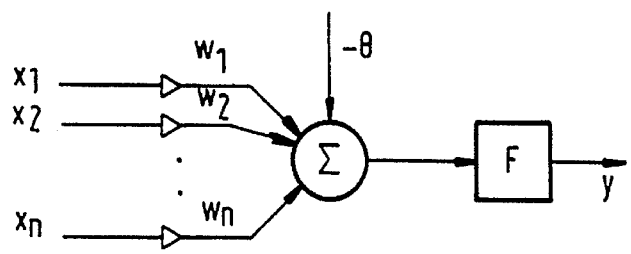
FIG. 1 is a block diagram of an elementary cell of a neural network.

FIG. 1 is a block diagram of an elementary cell, which is known per se, of a neutral network for which the invention is of particular importance. The cell, also called perceptron, comprises a number of inputs with input signals $x_1, x_2, x_3 \ldots x_n$. These signals may originate from a preceding perceptron, but they may alternatively be signals which are supplied to the network by an external source. The input signals are each multiplied by a weight factor $w_1, w_2, w_3, \ldots w_n$. The input signals thus weighted are summed by the summation device $\Sigma$. The sum is transported to the output via a non-linear function F, where $y=F(\Sigma w_i x_i - \theta)$. The inputs $x_i$ together with the multipliers $w_i$ form so-called synapse, while the summation device $\Sigma$ together with the block forming the function F is often called neuron in the literature. The weight factors $w_i$ are preferably programmable in analog manner and are set by means of an adjustment procedure such that the network carries out a desired function.

Figure 2:
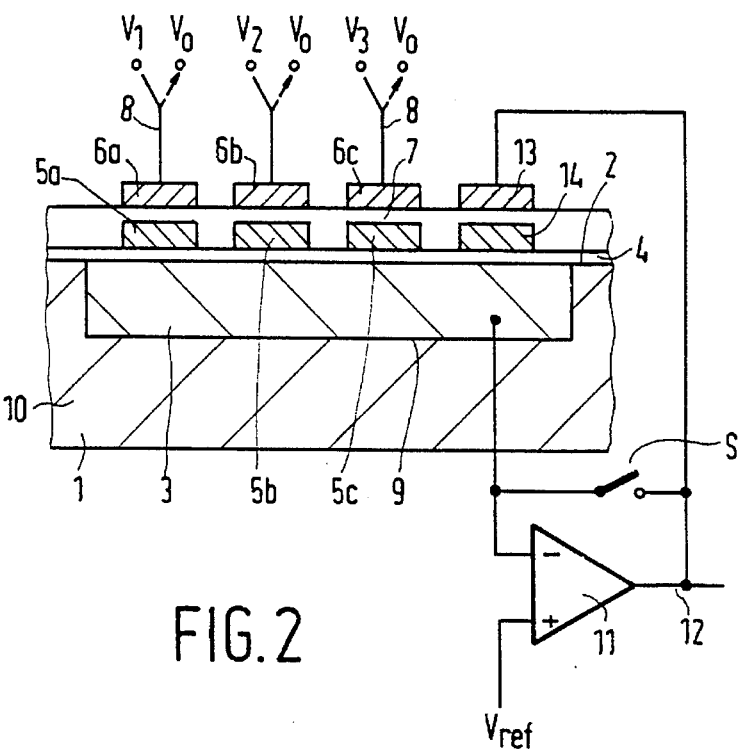
FIG. 2 diagrammatically shows a semiconductor device according to the invention for use in such a cell.

FIG. 2 diagrammatically shows a device according to the invention with which the functions depicted in FIG. 1 can be carried out. The device comprises a semiconductor body 1 which in this example is made of silicon but which obviously may also be made of an alternative suitable semiconductor material, and which comprises a surface region 3 of a first conductivity type which adjoins a surface 2. The surface region 3 in this example is of the n-type, but it will be obvious that this is not essential to the invention. In addition, the surface region 3 is formed by a coherent region in this example. It is alternatively possible, however, for the surface region to be built up from a number of subregions which correspond to the various capacitors, which are laterally separated within the semiconductor body, and which are interconnected by means of wiring. The surface 2 is provided with an electrode configuration which is electrically insulated from the surface by an insulating layer 4 of, for example, silicon oxide which forms a gate dielectric with a thickness of, for example, 25 nm. The insulated electrode configuration comprises an electrically floating gate 5 formed on the oxide layer 4 and a number of input electrodes 6a, 6b, 6c which are provided with connection means 8 for the supply of the input signals, indicated with the voltages $V_1, V_2, V_3$, etc. The input electrodes 6a, 6b, 6c are insulated from the floating gate 5 by the electrically insulating layer 7 and are capacitively coupled to the floating gate via the dielectric layer 7. In this example, the layer 7 between the gates 5 and 6 is formed by a silicon oxide layer with a thickness of, for example, 30 nm. Obviously, alternative materials such as silicon nitride or oxynitride may be used for the layer 7. The floating gate 5 may be provided in a manner known per se in the form of polycrystalline silicon (poly), while the electrodes 6 may be formed by poly or metal electrodes or alloys of, for example, silicon and a metal.

According to the invention, a floating gate 5a, 5b, 5c is associated with each input electrode 6a, 6b, 6c and situated between the relevant input electrode 6i and the surface region 3. Since the floating gate electrode 5 is subdivided into a number of mutually separated gates, it is possible to provide electric charges on the floating gates which are representative of the weight factors by which the input signals $V_i$ are multiplied. The electric charge may be applied to the floating gates by means which are analogous to those in nonvolatile floating-gate memories. This will be described further with reference to FIG. 3. The summation of the weighted input signals takes place in the surface region 3 formed by an n-type zone which adjoins a p-type portion 10 of the semiconductor body via a pn junction 9. The sum of the weighted input signals is stored in the surface region 3 in the form of electric charge. Means are present for this purpose by which the surface region 3 is given a reference potential in a first operational state and is made electrically floating in a second operational state. These means in the present example comprise the switch S and the differential amplifier 11 of which one input, here the−input, is connected to the surface region 3, while its+input is connected to a reference voltage source $V_{ref}$. The surface zone 3 can be connected with electrical conduction to the output 12 of the differential amplifier by means of the switch S, so that the potential of the surface region 3 becomes equal or at least substantially equal to $V_{ref}$ owing to the feedback. A feedback capacitor is further provided between the surface region 3 and the output 12 of the differential amplifier 11, one plate being formed by the surface region 3 and the other plate being formed by the conductor 13. This capacitance is built up in the same manner as the capacitances 6, 5, 3, as is evident from FIG. 2, and also comprises a floating gate 14 which is electrically insulated from the plate 13 by the oxide layer 7 and by means of which the charge/voltage characteristic can be set by means of the electric charge which can be stored on the floating gate 14.

Figure 3:
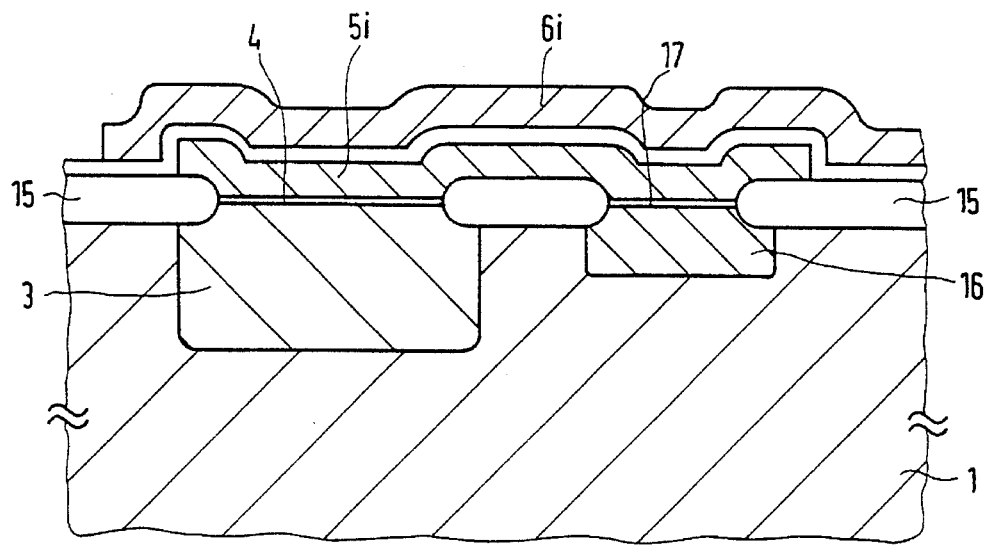
FIG. 3 is a cross-section of a practical embodiment of this device.

FIG. 3 is a cross-section taken, in a direction transverse to that of the cross-section of FIG. 2, of a practical realisation. The p-type silicon body 10 is provided at the surface with a comparatively thick field oxide 15 which defines the active regions of the semiconductor body. One of these active regions is formed by the n-type surface region 3. The floating gate 5i extends transversely across the width of the surface region 3 and is separated from this surface region by the oxide layer 4. Beyond the surface region 3, the floating gate 5i extends over an n-type zone 16 which is electrically insulated from the gate 5i by a very thin oxide layer 17. The thickness of the layer 17, for example 8 nm, is chosen to be so small that a tunnel current of a suitable value traverses the oxide 17 given a not too high voltage between the zone 16 and the floating gate 5i. The associated input electrode 6i is also shown in FIG. 3, overlapping the floating gate 5i over its entire surface area so as to achieve the strongest possible capacitive coupling.

Figure 4:
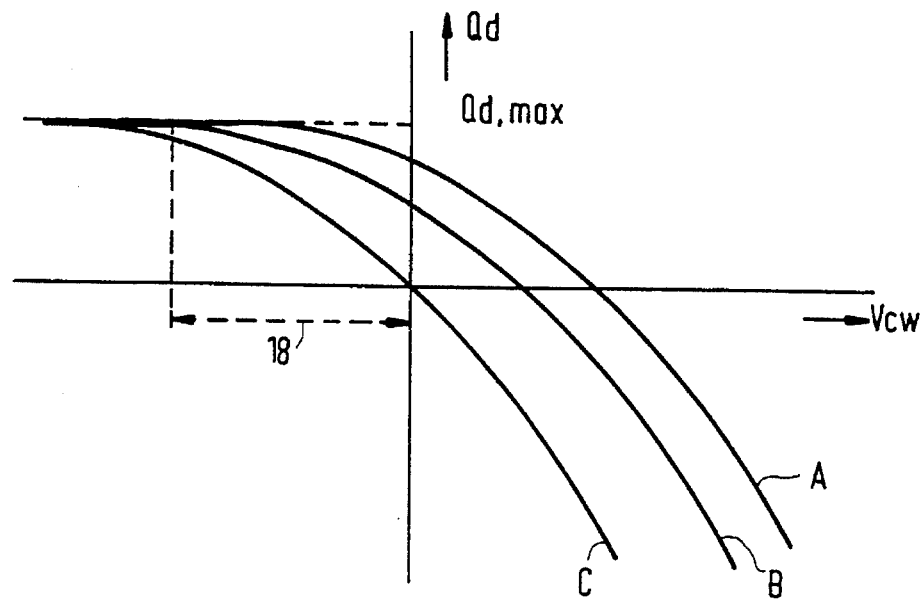
FIG. 4 is a graph depicting the relation between the input voltage and the charge induced thereby for various charge quantities on the floating gate.

It is assumed in the description of the operation of the device that the Fermi level (holes) is sufficiently high at the voltages applied for preventing inversion of the conductivity type at the boundary between the surface region 3 and the oxide layer 4. FIG. 4 shows the relation between the charge $Q_d$ of a depletion zone in the surface region 3 and the voltage $V_{cw}$ between the input gate 6i and the surface region 3 for three different charge quantities on the floating gate 5i. At a high negative voltage value $V_{cw}$, $Q_d$ becomes equal to $Q_{d,max}$, at which inversion of the conductivity type occurs at the surface. The threshold voltage at which the surface is inverted depends on the charge stored on the floating gate and in the present example becomes lower in proportion as less negative charge is present on the floating gate. The values of $V_{cw}$ at which the curves intersect the $V_{cw}$ axis are the flat-band voltages, which are also dependent on the charge state of the floating gate. At a voltage greater than the relevant flat-band voltage, an accumulation of electrons takes place at the surface. Curve A gives the relation between $Q_d$ and $V_{cw}$ with a maximum negative charge on the floating gate, curve C with a minimum negative charge on the floating gate, and curve B for an intermediate value of the charge on the floating gate. The region within which the input voltage can vary is indicated with the reference numeral 18 in FIG. 4. To be able to store positive as well as negative charge, depending on the input signal, the difference may be determined between the charge $Q_d$ for an input signal $V_{cw}$ and the charge $Q_d$ for a reference voltage $V_{ref}$ whose value is chosen to lie, for example, half way the voltage region 18. The curves A', B' and C', corresponding to the respective curves A, B and C in FIG. 4, as shown in FIG. 5 are then obtained.

The operation of the device is described with reference to FIG. 6. Two input electrodes 6a and 6b are diagrammatically indicated in this Figure, as is the output electrode 13. The input and output electrodes are depicted as capacitors in conjunction with the surface region 3. The floating gates are shown in broken lines in the dielectric of these capacitors. FIG. 6a shows the situation where the input signals $V_1$ and $V_2$ are sampled, the switches $S_1$ and $S_2$ connecting the electrodes 6a and 6b to $V_1$ and $V_2$, respectively. At the same time, the surface region 3 is short-circuited to the output $V_{out}$ of the amplifier 11 via switch S, so that the potential of the (non-depleted portion of) surface region 3 is equal to or at least substantially equal to $V_{ref}$. The charge on the capacitors 6i,3 is determined by the input signals Vi and by the charge state of the floating gates. In the next phase, shown in FIG. 5b, the charge stored in the capacitors 6i,3 is transported to the capacitor 13,3. For this purpose first switch S is opened, so that the output of amplifier 11 is no longer short-circuited with the−input. Then the input electrodes 6a and 6b are brought to the reference voltage $V_{ref}$ by the switches $S_1$ and $S_2$. Since the potential of the surface region remains at least substantially equal to $V_{ref}$, the charge induced by the input signals $V_1$ and $V_2$ is transferred to the capacitor 3, 13. The charge/voltage characteristic of this capacitor is used as the non-linear function F in the neural network diagram of FIG. 1, while it is possible to adjust the nature of this function within certain limits by means of the charge state of the floating gate in capacitor 13,3.

Figure 5:
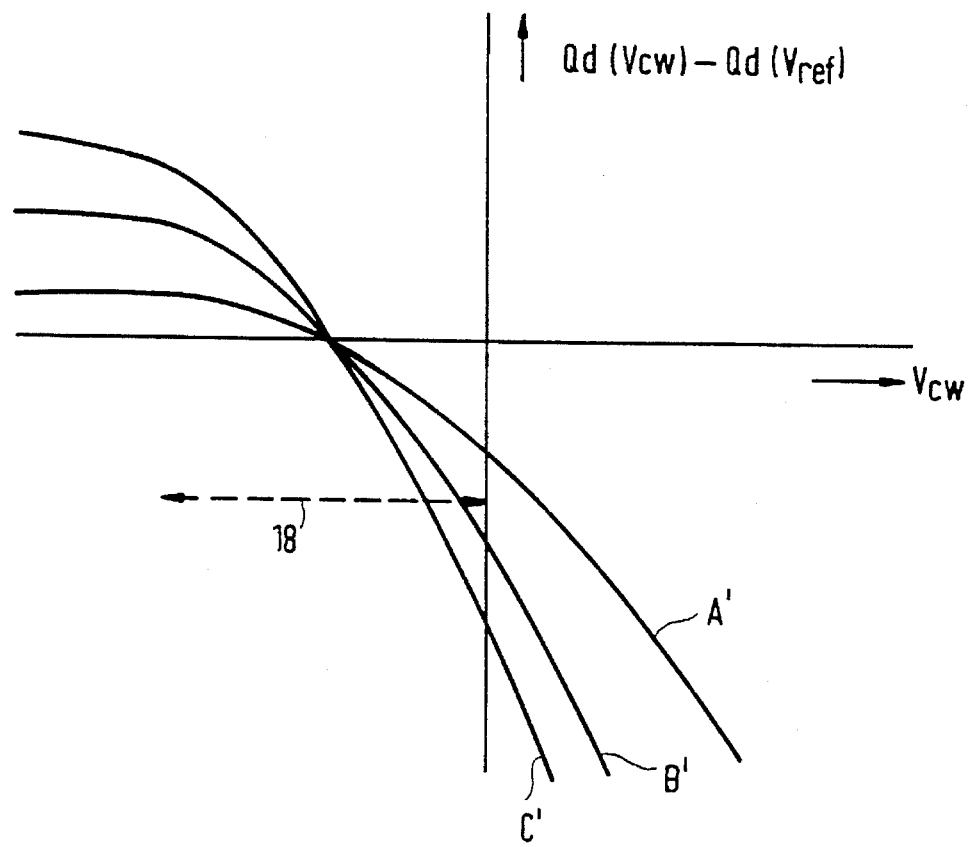
FIG. 5 is a graph depicting this relation differentially relative to the charge induced at a reference voltage.
Figure 6A:
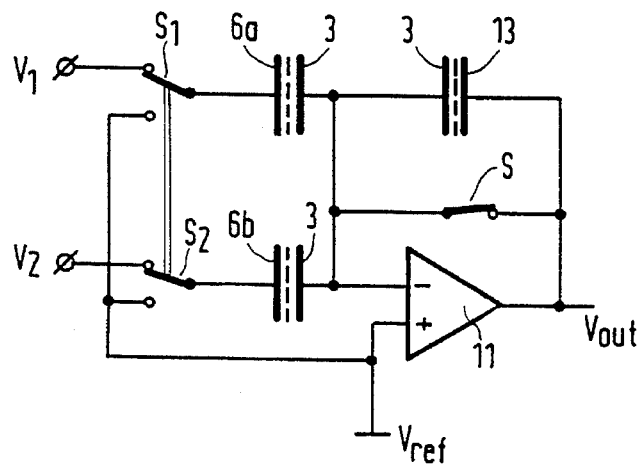
FIGS. 6a and 6b shows an electric circuit of the semiconductor device of FIG. 2 during a sampling phase and a transfer phase.
Figure 6B:
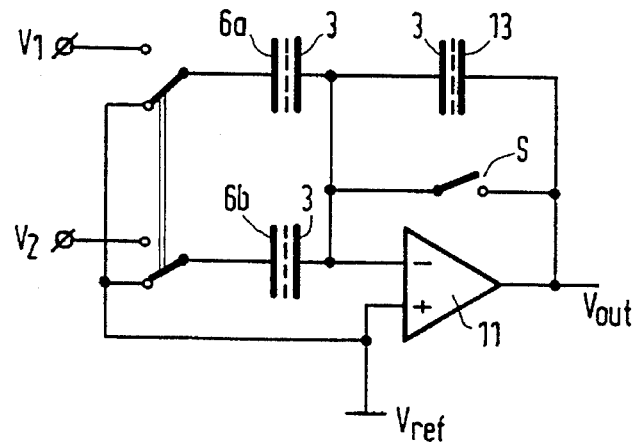
Figure 7:
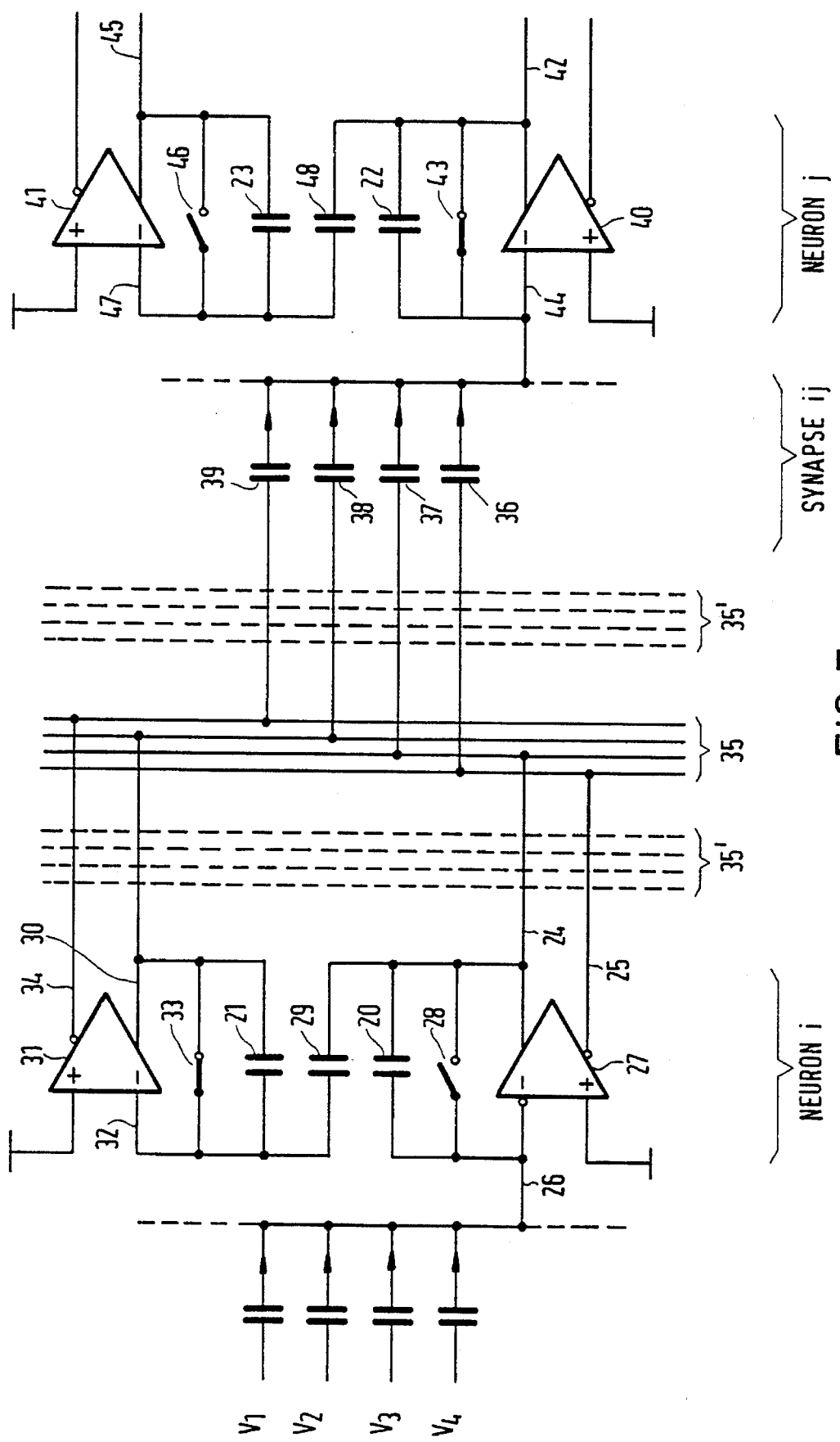
FIG. 7 is a circuit diagram of a neural network according to the invention in which an input signal is sampled in four different ways.

The charge $Q_d$ versus $V_{cw}$ relation of FIG. 4 or FIG. 5 is one of four possible types. A second type is obtained through mirroring of the characteristics of FIG. 4 or FIG. 5 relative to the line $V_{cw} = V_{ref}$. A third type is obtained when the characteristics of FIG. 4 or FIG. 5 are mirrored relative to the $V_{cw}$ axis. The fourth type is obtained when the characteristics of the second type are mirrored relative to the $V_{cw}$ axis. The second type can be implemented in that the input signal is applied to the input electrode 6 in inverted form as $2V_{ref}-V_{in}$. Type 3 and type 4 can be implemented in that the charges obtained by the methods of type 1 and type 2, respectively, are subtracted from the inputs of the subsequent neurons. FIG. 7 shows a circuit diagram of a possible embodiment of a neural network in which the four types described here are present. It is assumed here that the reference voltage $V_{ref}$ is equal to 0 V. The drawing shows two neurons i and j, coupled by the synapse ij. The input and output electrodes are simply depicted as capacitors. The floating gates in these capacitors, indicated with broken lines in FIG. 6, are not shown in FIG. 7 for keeping the drawing simple, but they are presumed to be present. Each amplifier has two outputs, a noninverting output such as is also present in the diagram of FIG. 6, and an inverting output which is indicated with an o—symbol to distinguish it from the other output. The inverting inputs of the amplifiers have been given the same symbol. Each neuron comprises two output capacitors, 20 and 21 in neuron j and 22 and 23 in neuron j. The capacitors 20 and 22 may be of the type as described above, with a variable capacitance. The capacitors 21 and 23, on the other hand, have a constant capacitance within the voltage range utilized. The capacitor 20 is coupled between the non-inverting output 24 and the inverting input 26 of amplifier 27. The capacitor 20 can be short-circuited with switch 28. Amplifier 27, switch 28 and capacitor 20 supply an output signal of type 1 at the output 24, as in the circuit of FIG. 6, given the input signal $V_1$–$V_4$. The inverting output 25 of amplifier 27 supplies the inverted output signal, i.e. a signal of type 2 described above. The second output capacitor 21 serves for the signals of types 3 and 4. The capacitance of capacitor 21 is, for example, equally great or approximately equally great as that of capacitor 20. Capacitor 21 is coupled to capacitor 20 via a dummy capacitor 29 of fixed capacitance. Capacitor 21 couples the noninverting output 30 of amplifier 31 to the inverting input 32. The output 30 is connected to input 32 by means of a switch 33 which is operated substantially in antiphase with switch 28. Output 30 supplies an output signal of type 3, as will be explained further below. Amplifier 31 has an inverting output 34 which supplies an output signal of type 4. The outputs 24, 25, 30 and 34 are each connected to a relevant input electrode 36–39 of the synapse ij via connection lines 35. Neuron j may be connected, not only to neuron i, but also to further neurons via synapses i',j (not shown), which is diagrammatically indicated in FIG. 7 with the broken-line connections 35'. The means for setting input electrodes 36, 37 and 38, 39 for the reference potential, formed by the switches $S_1$ and $S_2$ in the circuit of FIG. 6, are formed by the respective switches 28 and 33 in neuron i in the circuit of FIG. 7. The construction of neuron j is, for example, identical to that of neuron i and comprises two amplifiers 40 and 41. The non-inverting output 42 of amplifier 40 is connected to the inverting input 44 via switch 43 which is operated in synchrony with switch 33. In an analogous manner, the noninverting output 45 of amplifier 41 is connected to the inverting input 47 via switch 46 which is switched in synchrony with switch 28. The output capacitors 22 and 23 are coupled by dummy capacitor 48 of fixed capacitance.

The description of the circuit starts with the situation in which the input signals $V_1$–$V_4$ have been sampled, switch 28 is open (non-conducting), and the input electrodes to which the input signals were applied are again at the reference level (0 V). The electric charge representing the sum of the weighted input signals is now entirely or at least substantially entirely stored in the output capacitor 20. Output 24 gives the output signal $V_{out}$, while the inverting output 25 gives the output signal –$V_{out}$. At the same time, switches 43 and 33 are closed (conducting), so that the input 44 of amplifier 40 in neuron j and the input 32 of amplifier 31 are at the reference voltage. The output signals of amplifier 27 are supplied to the input electrodes 36 and 37 of synapse ij via the connection lines 35 and converted in weighted form into electric charge. Simultaneously, the reference voltage is applied to the input electrodes 38 and 39 of synapse ij through the closed switch 33. In the next phase, the switches 33 and 44 are first opened, after which the switches 28 and 46 are closed. The input electrodes 36 and 37 are again brought to the reference voltage again, while the depletion charge induced by these electrodes is stored in the output capacitor 22 of neuron i. A charge is also induced in the output capacitor 21 of amplifier 31 via the dummy capacitor 23, which charge corresponds to the charge which was stored in capacitor 20 of amplifier 27. The outputs 30 and 34 of the output amplifier 31 give the output signals $V_{out}$ and –$V_{out}$ which are weighted in synapse ij by means of the weight signals stored in capacitors 38 and 39 and which induce a depletion charge which is subtracted from the charge at the output capacitance.

Figure 8:
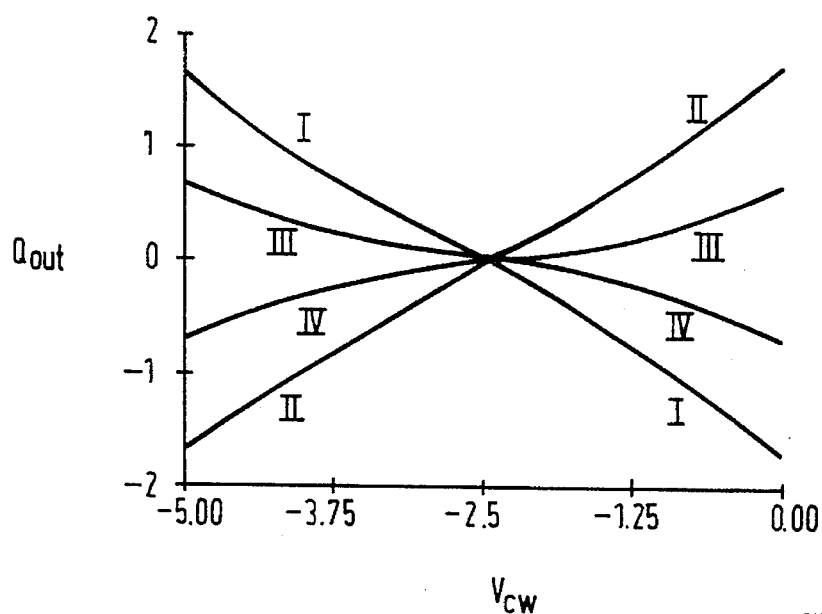
FIG. 8 shows the charge of the output capacitance as a function of $V_{cw}$ for a device with these sampling methods for four different combinations of charges on the floating gates.

FIG. 8 shows four curves, referenced I, II, III and IV, of the charge $Q_{out}$ at the synapse with the four signal input types described above for four different combinations of weight factors at the floating gates. The input voltage $V_{cw}$, which may have a value between 0 V and –5 V, is plotted on the horizontal axis, with $V_{ref}$=–2.5 V. The charge $Q_{out}$ in pC is plotted on the vertical axis. Curve I gives $Q_{out}$ in the situation in which a maximum charge is present on the floating gates of types 1 and 4, while a minimum charge is stored on the floating gates of types 2 and 3. Curve II gives $Q_{out}$ in the reverse situation, i.e. a maximum charge on floating gates of types 2 and 3 and a minimum charge on floating gates of types 1 and 4. In curve III, the charges on the floating gates 1 and 2 are a minimum and the charges on the floating gates of types 3 and 4 a maximum. Curve IV gives $Q_{out}$ in the reverse situation.

Figure 9A:
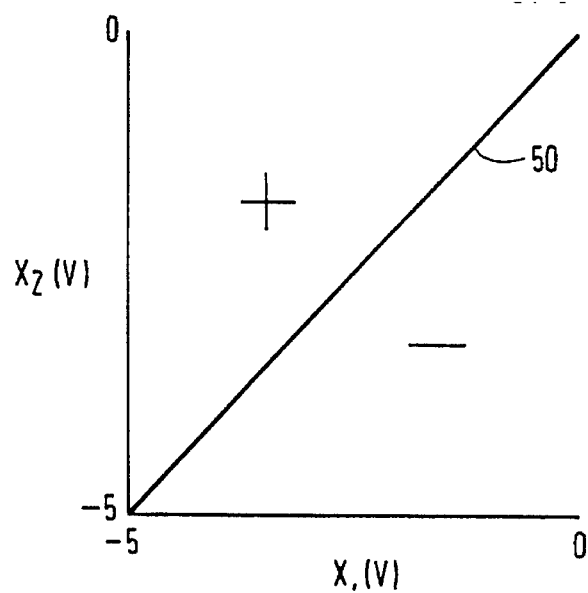
FIGS. 9a to 9c contain graphs depicting some signal processing operations by means of a semiconductor device according to the invention.

It is obviously not necessary for the four conversions described above to occur together in one synapse. FIG. 9a gives an example of two input signals $X_1$ and $X_2$ for which the weight factors were chosen in accordance with curve I and curve II, respectively, in FIG. 8. The signals $X_1$ and $X_2$ can be classified into two classes with this setting, i.e. the class $X_1$>$X_2$ and the class $X_1$<$X_2$. The operation carried out can be indicated in the region in the $X_1$, $X_2$ diagram for which the following is true:

$Q_{out}(X_1)+Q_{out}(X_2)>Q_{threshold}$, with $Q_{threshold}$=0° C. being chosen for simplicity's sake.

Figure 9B:
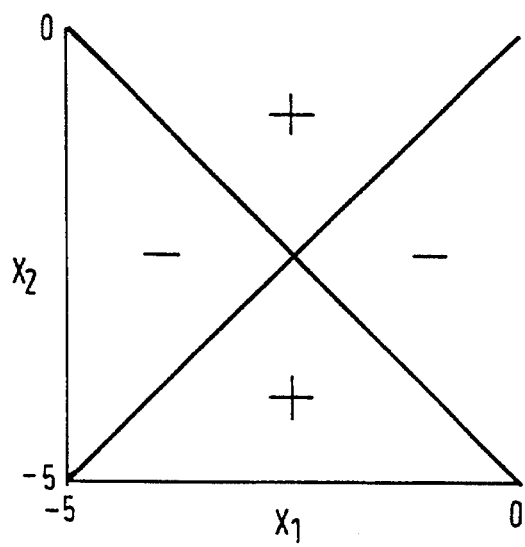
Figure 9C:
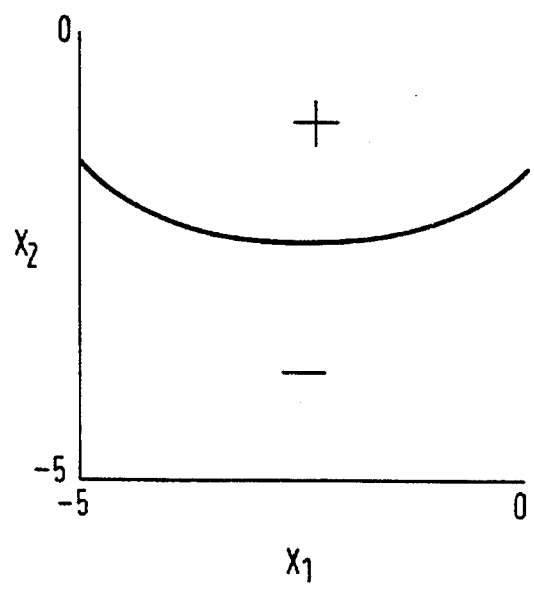

It may be readily deduced from the diagram of FIG. 8 that this equation with the weight factors belonging to curves I and II is complied with in the region indicated with a + sign in FIG. 9. The complementary region is provided with a – sign; line 50 gives the boundary between the two regions. FIG. 9b gives a similar diagram, however, the synapse is set for the curves IV and III of FIG. 8. The diagram is now divided into four quadrants, which may be readily derived from the curves III and IV. FIG. 9c shows the diagram with the synapse set for the curves IV and II in FIG. 8.

It will be obvious that the invention is not limited to the embodiments given here, but that many more variations are possible to those skilled in the art within the scope of the invention. Thus a p-type surface zone may be formed in the n-type surface region 3, which zone is situated, seen at the surface, next to the floating gate or gates and which is set for such a low voltage that inversion of the conductivity type below the floating gate or gates is prevented. The conductivity types of the examples given here may be inverted, in which case obviously also the applied voltages are to be adapted.

In the embodiment of FIG. 7, the capacitors 20 and 22 may be fixed instead of variable capacitors. In that case they may have a fixed, i.e. substantially voltage-independent capacitance, and thus be formed, for example, by two conductive layers separated by an interposed dielectric. It is also possible to provide the feedback of the amplifiers by means of a combination of adjustable capacitors with which a function F (FIG. 1) of a more complicated nature can be implemented. Furthermore, the weight factors in the embodiments described may be set, not only by means of electrical charges on the floating gates, but also through the choice of the vertical doping profile in the surface region 3.

I claim:

1. A semiconductor device for the summation of a number of weighted input signals, comprising a semiconductor body with a surface region of a first conductivity type adjoining a surface, which surface is provided with an electrode configuration which is insulated from the surface region and has an electrically floating gate and, for the supply of the signals to be summed, with a number of input electrodes which are electrically insulated from the surface of the semiconductor body and from the floating gate and which are capacitively coupled to the floating gate, characterized in that a floating gate electrode is associated with each input electrode, in that means are present for applying an electric charge to each of said floating gate electrodes, which charge is representative of a weight factor with which an input signal supplied to the associated input electrode is weighted, and in that the surface region merges into an adjoining portion of the semiconductor body of the second conductivity type via a pn junction and forms a charge storage region for storing electric charge whose value is indicative of the sum of the weighted input signals, means being present by which the surface region can be brought to a reference potential in a first operational state and to an electrically floating potential in a second operational state.

2. A semiconductor device as claimed in claim 1, characterized in that the surface region is electrically connected to an input of a differential amplifier of which another input is connected to a junction point which is at the reference potential during operation.

3. A semiconductor device as claimed in claim 2, characterized in that switching means are present whereby the output of the amplifier can be connected to the surface region and whereby a reference voltage or an input signal can be applied to the input electrodes.

4. A semiconductor device as claimed in claim 2, characterized in that the surface region and the output of the amplifier are electrically interconnected via a feedback capacitor.

5. A semiconductor device as claimed in claim 4, characterized in that the feedback capacitor comprises an electrically conductive, floating region situated between a region of the semiconductor body connected to the surface region which forms a plate of the feedback capacitor and a conductive layer forming the other plate of the feedback capacitor and insulated from the surface region and the interposed electrically floating region by insulating material.

6. A semiconductor device as claimed in claim 1, characterized in that means are present whereby alternately an input signal and a reference voltage can be applied to the input electrodes during operation.

7. A semiconductor device as claimed in claim 1, characterized in that an injector region separated from the floating gate by a tunnel dielectric is associated with each of the input electrodes and the relevant floating gates.

8. A semiconductor device as claimed in claim 7, characterized in that the injector region is formed by a surface zone of the first conductivity type which is provided in said adjoining portion of the semiconductor body of the second conductivity type and which is laterally separated from the surface region of the first conductivity type.

9. A semiconductor device as claimed in claim 1, characterized in that a number of input electrodes with associated floating gates is present, to which a common input signal is applied in mutually differing manners.

10. A semiconductor device as claimed in claim 9, characterized in that said number of input electrodes is four, while the input signal is applied to the input electrodes such that, when the input signal $V_{in}$ resulting in a charge $Q_{d1}$ in the surface region is applied to a first input electrode and the input signal in the form $-V_{in}$ resulting in a charge $Q_{d2}$ is applied to a second input electrode, the input signal applied to a third input electrode is applied in a form whereby a charge $-Q_{d1}$ is induced in the surface region, given a weight factor equal to the weight factor belonging to the first input electrode, and the input signal for the fourth input electrode is applied in a form whereby a charge $-Q_{d2}$ is induced in the surface region given a weight factor equal to the weight factor belonging to the second input electrode.

11. A semiconductor device as claimed in claim 1, characterized in that the surface region is provided with one or several regions forming a rectifying junction with the surface region, with which junction inversion of the conductivity type below the floating gates is prevented through the application of a reverse voltage.

* * * * *